(12) United States Patent
Nakamura et al.

(10) Patent No.: US 12,278,120 B2
(45) Date of Patent: Apr. 15, 2025

(54) SUBSTRATE TREATMENT DEVICE

(71) Applicant: SHIBAURA MECHATRONICS CORPORATION, Yokohama (JP)

(72) Inventors: Minami Nakamura, Yokohama (JP); Kensuke Demura, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 327 days.

(21) Appl. No.: 17/704,135

(22) Filed: Mar. 25, 2022

(65) Prior Publication Data

US 2022/0310417 A1    Sep. 29, 2022

(30) Foreign Application Priority Data

Mar. 29, 2021 (JP) ................... 2021-054611
Jan. 20, 2022 (JP) ................... 2022-006929

(51) Int. Cl.
*H01L 21/67* (2006.01)
*H01L 21/687* (2006.01)

(52) U.S. Cl.
CPC .. *H01L 21/67051* (2013.01); *H01L 21/67103* (2013.01); *H01L 21/67248* (2013.01); *H01L 21/67253* (2013.01); *H01L 21/68764* (2013.01)

(58) Field of Classification Search
CPC ......... H01L 21/67051; H01L 21/67103; H01L 21/67109; H01L 21/67248; H01L 21/67253; H01L 21/68764
See application file for complete search history.

(56) References Cited

U.S. PATENT DOCUMENTS

| 2018/0047559 A1* | 2/2018 | Kamiya | H01L 21/67051 |
| 2018/0272391 A1* | 9/2018 | Sakurai | H01L 21/68735 |
| 2020/0078833 A1* | 3/2020 | Takai | H01L 21/68728 |

FOREIGN PATENT DOCUMENTS

| JP | 2018-026436 A | 2/2018 |
| JP | 2018-160615 A | 10/2018 |
| JP | 2020-043128 A | 3/2020 |

* cited by examiner

*Primary Examiner* — Douglas Lee
(74) *Attorney, Agent, or Firm* — MCDONALD HOPKINS LLC (57) ABSTRACT

A substrate treatment device includes a placement platform rotating a substrate, a cooling part supplying a cooling gas to a space between the placement platform and the substrate, a liquid supplier supplying a liquid to a surface of the substrate opposite to the placement platform side, a detector that is above the surface of the substrate and detects a freezing start of the liquid, and a controller controlling the substrate rotation, the cooling gas supply, and the liquid supply. The controller controls at least one of the substrate rotation, the cooling gas flow rate, or the liquid supply rate, and causes the liquid on the substrate surface to reach a supercooled state; and when determining based on a signal from the detector that the freezing of the supercooled liquid has started, the controller starts thawing the frozen liquid after a prescribed interval has elapsed from the freezing start of the liquid.

18 Claims, 7 Drawing Sheets

SUBSTRATE TREATMENT DEVICE

CROSS-REFERENCE TO RELATED APPLICATIONS

This application is based upon and claims the benefit of priority from the Japanese Patent Application No. 2021-054611, filed on Mar. 29, 2021, and Japanese Patent Application No. 2022-006929, filed on Jan. 20, 2022; the entire contents of which are incorporated herein by reference.

FIELD

Embodiments described herein relate generally to a substrate treatment device.

BACKGROUND

Freeze cleaning has been proposed to remove contaminants such as particles and the like from the surface of a substrate such as an imprint template, a photolithography mask, a semiconductor wafer, etc.

When, for example, purified water is used as the cleaning liquid of freeze cleaning, first, the purified water and a cooling gas are supplied to the surface of a rotating substrate. Then, the supply of the purified water is stopped, and a water film is formed on the surface of the substrate while discharging a portion of the supplied purified water. The water film is frozen by the cooling gas supplied to the substrate. When the water film freezes to form an ice film, contaminants such as particles and the like are detached from the surface of the substrate by being incorporated into the ice film. Then, the ice film is melted by supplying purified water to the ice film; and the contaminants are removed from the surface of the substrate together with the purified water.

Technology has been proposed in which a process (a supercooling process) of causing the water film to reach a supercooled state is performed before the process (the freezing process) of forming the ice film, and a process (a preliminary process) of performing preliminary cooling of the substrate is performed before the supercooling process.

Generally, the timing of melting the ice film (the timing of starting the thawing process) is performed by time management. For example, the melting of the ice film is started by assuming that the temperature of the ice film will reach a predetermined temperature when a predetermined interval has elapsed from the start of the processing of the freeze cleaning. It had been considered that in such a case, the interval from the start of the processing until the temperature of the ice film reaches the predetermined temperature can be stabilized for each substrate if the preliminary process is performed. As long as the interval from the start of the processing until the temperature of the ice film reaches the predetermined temperature can be stabilized for each substrate, the removal rate of the contaminants also can be stabilized for each substrate.

However, fluctuation of the removal rate of the contaminants occurs between substrates.

It is therefore desirable to develop technology that can suppress the fluctuation between substrates of the removal rate of the contaminants.

DETAILED DESCRIPTION

A substrate treatment device according to an embodiment includes a placement platform configured to rotate a substrate, a cooling part configured to supply a cooling gas to a space between the placement platform and the substrate, a liquid supplier configured to supply a liquid to a surface of the substrate opposite to the placement platform side, a detector that is above the surface of the substrate and is configured to detect a start of freezing of the liquid, and a controller that is configured to control a rotation of the substrate, a supply of the cooling gas, and a supply of the liquid. The controller controls at least one of the rotation of the substrate, a flow rate of the cooling gas, or a supply rate of the liquid, and causes the liquid on the surface of the substrate to reach a supercooled state; and when determining based on a signal from the detector that the freezing of the liquid in the supercooled state has started, the controller starts thawing the frozen liquid after a prescribed interval has elapsed from the start of the freezing of the liquid.

Embodiments will now be illustrated with reference to the drawings. Similar components in the drawings are marked with the same reference numerals; and a detailed description is omitted as appropriate.

A substrate 100 that is illustrated below can be, for example, a semiconductor wafer, an imprint template, a photolithography mask, a plate-shaped body used in a MEMS (Micro Electro Mechanical System), etc.

An uneven portion that is a pattern may be formed in the surface of the substrate 100, or an uneven portion may not be formed. A substrate in which an uneven portion is not formed can be, for example, a substrate before an uneven portion is formed (e.g., a so-called bulk substrate), etc.

As an example, the substrate 100 is described below as a photolithography mask. The planar shape of the substrate 100 can be substantially quadrilateral when the substrate 100 is a photolithography mask.

Figure 1:
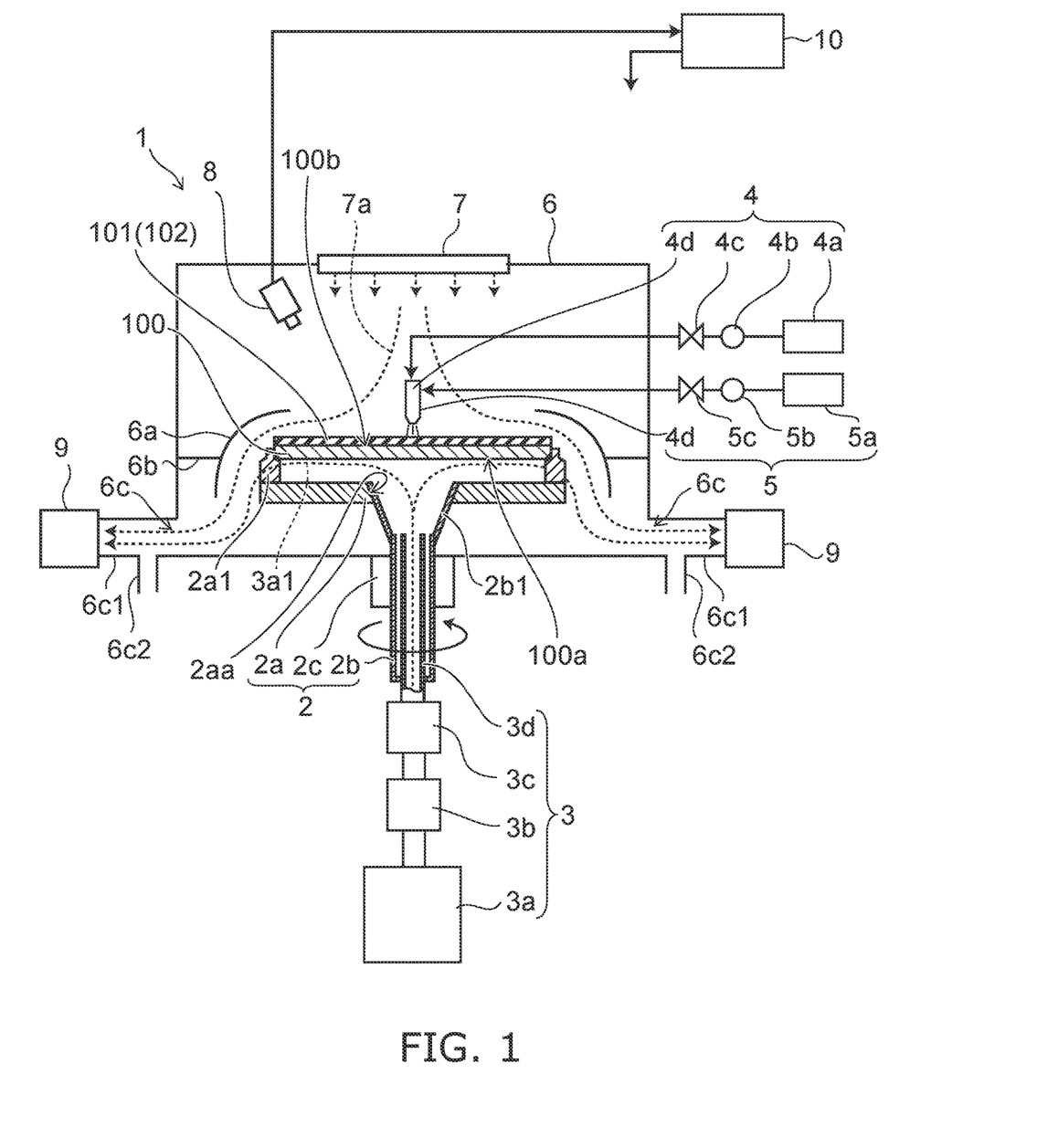
FIG. 1 is a schematic view illustrating a substrate treatment device according to an embodiment.

FIG. 1 is a schematic view illustrating a substrate treatment device 1 according to the embodiment.

As shown in FIG. 1, the substrate treatment device 1 includes a placement part 2, a cooling part 3, a first liquid supplier 4, a second liquid supplier 5, a housing 6, a blower 7, a detector 8, an exhaust part 9, and a controller 10.

The placement part 2 includes a placement platform 2a, a rotary shaft 2b, and a driver 2c.

The placement platform 2a can rotate the substrate 100. The placement platform 2a is rotatable inside the housing 6. The placement platform 2a is plate-shaped. Multiple supporters 2a1 that support the substrate 100 are located at one major surface of the placement platform 2a. When the substrate 100 is supported by the multiple supporters 2a1, a surface 100b of the substrate 100 (the surface at the side to be cleaned) faces away from the placement platform 2a side.

The edge of a back surface 100a of the substrate 100 contacts the multiple supporters 2a1. The portion of the supporter 2a1 that contacts the edge of the back surface 100a of the substrate 100 can be a tapered surface or an inclined surface. The supporter 2a1 and the edge of the back surface 100a of the substrate 100 can have point contact by setting the portion of the supporter 2a1 contacting the edge of the back surface 100a of the substrate 100 to be a tapered surface. The supporter 2a1 and the edge of the back surface 100a of the substrate 100 can have line contact by setting the portion of the supporter 2a1 contacting the edge of the back surface 100a of the substrate 100 to be an inclined surface. The occurrence of dirt, damage, etc., of the substrate 100 can be suppressed by providing point contact or line contact between the supporter 2a1 and the edge of the back surface 100a of the substrate 100.

A hole 2aa that extends through the placement platform 2a in the thickness direction is located at the central portion of the placement platform 2a.

One end portion of the rotary shaft 2b engages the hole 2aa of the placement platform 2a. The other end portion of the rotary shaft 2b is located outside the housing 6. The rotary shaft 2b is connected to the driver 2c outside the housing 6.

The rotary shaft 2b is tubular. An outlet 2b1 is located at the end portion of the rotary shaft 2b at the placement platform 2a side. The outlet 2b1 is open at the surface of the placement platform 2a at which the multiple supporters 2a1 are located. The end portion of the outlet 2b1 at the opening side is connected to the inner wall of the hole 2aa. The opening of the outlet 2b1 faces the back surface 100a of the substrate 100 placed on the placement platform 2a.

The outlet 2b1 has a shape in which the cross-sectional area increases toward the placement platform 2a side (the opening side). Therefore, the cross-sectional area of the hole inside the outlet 2b1 increases toward the placement platform 2a side (the opening side). Although a case is illustrated where the outlet 2b1 is located at a tip of the rotary shaft 2b, the outlet 2b1 also can be located a tip of a cooling nozzle 3d that is described below. Also, the hole 2aa of the placement platform 2a can be used as the outlet 2b1.

By including the outlet 2b1, a cooling gas 3a1 that is discharged can be supplied to a wider area of the back surface 100a of the substrate 100. Also, the discharge rate of the cooling gas 3a1 can be reduced. Therefore, partial cooling of the substrate 100 and an excessively high cooling rate of the substrate 100 can be suppressed. As a result, the supercooled state of a liquid 101 that is described below is easily generated. Also, the supercooled state of the liquid 101 can be generated in a wider area of the surface 100b of the substrate 100. Therefore, the removal rate of the contaminants can be improved.

The cooling nozzle 3d is mounted to the end portion of the rotary shaft 2b at the side opposite to the placement platform 2a side. A not-illustrated rotary shaft seal is located between the cooling nozzle 3d and the end portion of the rotary shaft 2b at the side opposite to the placement platform 2a side. The end portion of the rotary shaft 2b at the side opposite to the placement platform 2a side is airtightly sealed thereby.

The driver 2c is located outside the housing 6. The driver 2c is connected to the rotary shaft 2b. The driver 2c includes rotating equipment such as a motor, etc. The rotational force of the driver 2c is transferred to the placement platform 2a via the rotary shaft 2b. Therefore, the placement platform 2a as well as the substrate 100 placed on the placement platform 2a can be rotated by the driver 2c.

The driver 2c not only can start and stop the rotation but also can change the rotational speed (the speed of rotation). In such a case, the driver 2c can include, for example, a control motor such as a servo motor, etc.

The cooling part 3 supplies the cooling gas 3a1 to the space between the placement platform 2a and the back surface 100a of the substrate 100. The cooling part 3 includes, for example, a cooling liquid part 3a, a filter 3b, a flow rate controller 3c, and the cooling nozzle 3d. The cooling liquid part 3a, the filter 3b, and the flow rate controller 3c are located outside the housing 6.

The cooling liquid part 3a stores a cooling liquid and generates the cooling gas 3a1. The cooling liquid is the liquefied cooling gas 3a1. The cooling gas 3a1 is not particularly limited as long as the cooling gas 3a1 is a gas that does not easily react with the material of the substrate 100. The cooling gas 3a1 can be, for example, an inert gas such as nitrogen gas, helium gas, argon gas, etc.

In such a case, the cooling time of the substrate 100 can be reduced by using a gas having a high specific heat. For example, the cooling time of the substrate 100 can be reduced by using helium gas. Also, the processing cost of the substrate 100 can be reduced by using nitrogen gas.

The cooling liquid part 3a includes a tank that stores the cooling liquid, and a vaporizer that vaporizes the cooling liquid stored in the tank. A cooling device for maintaining the temperature of the cooling liquid is located in the tank. The vaporizer generates the cooling gas 3a1 from the cooling liquid by increasing the temperature of the cooling liquid. For example, the vaporizer can utilize the external air temperature or can use heat from a heating medium. It is sufficient for the temperature of the cooling gas 3a1 to be not more than the freezing point of the liquid 101; for example, the temperature of the cooling gas 3a1 can be $-170°$ C.

The filter 3b is connected to the cooling liquid part 3a via a pipe. The filter 3b suppresses the outflow toward the substrate 100 side of contaminants such as particles, etc., included in the cooling liquid.

The flow rate controller 3c is connected to the filter 3b via a pipe. The flow rate controller 3c controls the flow rate of the cooling gas 3a1. The flow rate controller 3c can be, for example, a MFC (Mass Flow Controller), etc. The flow rate controller 3c may indirectly control the flow rate of the cooling gas 3a1 by controlling the supply pressure of the cooling gas 3a1. In such a case, the flow rate controller 3c can be, for example, an APC (Auto Pressure Controller), etc.

The temperature of the cooling gas 3a1 generated from the cooling liquid in the cooling liquid part 3a is a substantially prescribed temperature. Therefore, the flow rate controller 3c can control the temperature of the substrate 100 as well as the temperature of the liquid 101 at the surface 100b of the substrate 100 by controlling the flow rate of the cooling gas 3a1. In such a case, the liquid 101 can be set to a supercooled state in a supercooling process described below by the flow rate controller 3c controlling the flow rate of the cooling gas 3a1.

The cooling nozzle 3d is tubular. One end portion of the cooling nozzle 3d is connected to the flow rate controller 3c. The other end portion of the cooling nozzle 3d is located inside the rotary shaft 2b. The other end portion of the cooling nozzle 3d is positioned at the vicinity of the end portion of the outlet 2b1 opposite to the placement platform 2a side (the opening side).

The cooling gas 3a1 of which the flow rate is controlled by the flow rate controller 3c is supplied to the substrate 100 by the cooling nozzle 3d. The cooling gas 3a1 that is discharged from the cooling nozzle 3d is directly supplied to the back surface 100a of the substrate 100 via the outlet 2b1.

The first liquid supplier 4 supplies the liquid 101 to the surface 100b of the substrate 100. A pressure wave is generated in a freezing process (solid-liquid phase) described below by the volume change when the liquid 101 changes into a solid. It is considered that the pressure wave detaches the contaminants adhered to the surface 100b of the substrate 100. Therefore, the liquid 101 is not particularly limited as long as the liquid 101 does not easily react with the material of the substrate 100.

However, if the liquid 101 is a liquid whose volume increases when it is frozen, it is considered that the contaminants adhering to the surface of the substrate 100 can be separated by utilizing the physical force accompanying the volume increase. It is therefore favorable for the liquid 101 to be a liquid that does not easily react with the material of the substrate 100 and of which the volume increases when freezing. For example, the liquid 101 can be water (e.g., purified water, ultrapure water, etc.), a liquid that includes water as a major component, etc.

Liquids that include water as a major component can be, for example, a mixed liquid of water and alcohol, a mixed liquid of water and an acid solution, a mixed liquid of water and an alkaline solution, etc.

A mixed liquid of water and alcohol can reduce the surface tension; it is therefore easy to supply the liquid 101 into fine uneven portions formed in the surface 100b of the substrate 100.

A mixed liquid of water and an acid solution can dissolve contaminants such as particles, resist residue, etc., adhered to the surface of the substrate 100. For example, a mixed liquid of water and sulfuric acid, etc., can dissolve contaminants made of resists and metals.

A mixed liquid of water and an alkaline solution can reduce the zeta potential; and the contaminants that are detached from the surface 100b of the substrate 100 can be thereby prevented from re-adhering to the surface 100b of the substrate 100.

However, there is a risk that the removal rate of the contaminants may decrease if there are too many components other than water because it is difficult to utilize the physical force accompanying the volume increase. It is therefore favorable for the concentration of the components other than water to be not less than 5 wt % and not more than 30 wt %.

A gas can be dissolved in the liquid 101. Gases can include, for example, carbon dioxide gas, ozone gas, hydrogen gas, etc. Charge neutralization and/or static electricity prevention of the substrate 100 can be performed by dissolving carbon dioxide gas in the liquid 101 because the conductivity of the liquid 101 can be increased. Contaminants that are made of organic substances can be dissolved by dissolving ozone gas in the liquid 101.

The first liquid supplier 4 includes, for example, a liquid container 4a, a supplier 4b, a flow rate controller 4c, and a liquid nozzle 4d. The liquid container 4a, the supplier 4b, and the flow rate controller 4c are located outside the housing 6.

The liquid container 4a stores the liquid 101 described above. The liquid 101 is stored in the liquid container 4a at a temperature that is greater than the freezing point. For example, the liquid 101 is stored at room temperature (20° C.).

The supplier 4b is connected to the liquid container 4a via a pipe. The supplier 4b supplies the liquid 101 stored in the liquid container 4a toward the liquid nozzle 4d. The supplier 4b can be, for example, a pump or the like that is resistant to the liquid 101. Although a case is illustrated where the supplier 4b is a pump, the supplier 4b is not limited to a pump. For example, the supplier 4b may supply the gas into the liquid container 4a and may feed liquid 101 stored in the liquid container 4a by pressurizing.

The flow rate controller 4c is connected to the supplier 4b via a pipe. The flow rate controller 4c controls the flow rate of the liquid 101 supplied by the supplier 4b. The flow rate controller 4c can be, for example, a flow rate control valve. The flow rate controller 4c can start and stop the supply of the liquid 101.

The liquid nozzle 4d is located inside the housing 6. The liquid nozzle 4d is tubular. One end portion of the liquid nozzle 4d is connected to the flow rate controller 4c via a pipe. The other end portion of the liquid nozzle 4d faces the surface 100b of the substrate 100 placed on the placement platform 2a. Therefore, the liquid 101 that is discharged from the liquid nozzle 4d is supplied to the surface 100b of the substrate 100.

The other end portion of the liquid nozzle 4d (the discharge port of the liquid 101) is positioned at substantially the center of the surface 100b of the substrate 100. The liquid 101 that is discharged from the liquid nozzle 4d spreads from substantially the center of the surface 100b of the substrate 100 and forms a liquid film of a substantially constant thickness on the surface 100b of the substrate 100. The film of the liquid 101 formed at the surface 100b of the substrate 100 is called a liquid film hereinbelow.

The second liquid supplier 5 supplies a liquid 102 to the surface 100b of the substrate 100. The second liquid supplier 5 includes, for example, a liquid container 5a, a supplier 5b, a flow rate controller 5c, and a liquid nozzle 4d. The liquid container 5a, the supplier 5b, and the flow rate controller 5c are located outside the housing 6.

The liquid 102 can be used in a thawing process that is described below. Therefore, the liquid 102 is not particularly limited as long as the liquid 102 does not easily react with the material of the substrate 100 and the liquid 102 does not easily remain at the surface 100b of the substrate 100 in a drying process that is described below. The liquid 102 can be, for example, water (e.g., purified water, ultrapure water, etc.), a mixed liquid of water and alcohol, etc.

The liquid container 5a can be similar to the liquid container 4a described above. The supplier 5b can be similar to the supplier 4b described above. The flow rate controller 5c can be similar to the flow rate controller 4c described above.

The second liquid supplier 5 can be omitted when the liquid 102 and the liquid 101 are the same. Although the liquid nozzle 4d is illustrated as being used for both the liquids 102 and 101, the liquid nozzle that discharges the liquid 101 and the liquid nozzle that discharges the liquid 102 can be included separately.

The temperature of the liquid 102 can be greater than the freezing point of the liquid 101. The temperature of the liquid 102 can be a temperature at which the frozen liquid 101 can be thawed. The temperature of the liquid 102 can be, for example, about room temperature (20° C.).

When the second liquid supplier 5 is omitted, the first liquid supplier 4 is used in the thawing process. That is, the liquid 101 is used. In such a case, the temperature of the liquid 101 can be a temperature at which the frozen liquid 101 can be thawed. The temperature of the liquid 101 can be, for example, about room temperature (20° C.).

The housing 6 is box-shaped. A cover 6a is located inside the housing 6. The liquids 101 and 102 that are supplied to the substrate 100 and are discharged outward from the substrate 100 by the rotation of the substrate 100 are caught by the cover 6a. The cover 6a is tubular. The cover 6a is bent toward the center of the cover 6a at the vicinity of the end portion at the side opposite to the placement platform 2a side (the upper end vicinity of the cover 6a). Therefore, the liquids 101 and 102 that scatter above the substrate 100 can be easily caught.

A divider 6b also is located inside the housing 6. The divider 6b is located between the outer surface of the cover 6a and the inner surface of the housing 6.

Multiple outlets 6c are provided in the side surface of the housing 6 at the bottom surface side. The housing 6 illustrated in FIG. 1 includes two outlets 6c. The used cooling gas 3a1, air 7a, liquid 101, and liquid 102 are discharged out of the housing 6 through the outlet 6c.

The outlet 6c is lower than the substrate 100. Therefore, the cooling gas 3a1 that is exhausted from the outlet 6c creates a downflow. As a result, particles can be prevented from floating around.

The multiple outlets 6c are symmetrically located with respect to the center of the housing 6 when viewed in plan. Thus, the exhaust direction of the cooling gas 3a1 is symmetric with respect to the center of the housing 6. The exhaust of the cooling gas 3a1 is smooth when the exhaust direction of the cooling gas 3a1 is symmetric.

The blower 7 is located at the ceiling surface of the housing 6. The blower 7 can be located at the side surface of the housing 6 as long as the blower 7 is at the ceiling side. The blower 7 can include a filter and a circulator such as a fan, etc. The filter can be, for example, a HEPA filter (High Efficiency Particulate Air Filter), etc.

The blower 7 supplies the air 7a (the external air) to the space between the divider 6b and the ceiling of the housing 6. Therefore, the pressure of the space between the divider 6b and the ceiling of the housing 6 is greater than the external pressure. As a result, the air 7a that is supplied by the blower 7 is easily guided to the outlet 6c. Also, the penetration of contaminants such as particles, etc., into the housing 6 through the outlet 6c can be suppressed.

The blower 7 supplies the air 7a that is room temperature to the surface 100b of the substrate 100. Therefore, the blower 7 can change the temperatures of the liquids 101 and 102 on the substrate 100 by controlling the supply rate of the air 7a. For example, the blower 7 can control the supercooled state of the liquid 101 in the supercooling process described below, promote the thawing of the liquid 101 in the thawing process described below, and promote the drying of the liquid 102 in the drying process described below.

The detector 8 is located in the space between the divider 6b and the ceiling of the housing 6. For example, the detector 8 detects the temperature of the liquid film (the liquid 101), the temperature of the film in which the liquid 101 and the frozen liquid 101 are mixed, and the temperature of the frozen liquid 101 (the frozen film). In such a case, the detector 8 can be, for example, a radiation thermometer, a thermo-viewer, a thermocouple, or a resistance thermometer bulb. The detector 8 may detect the thickness of the film and/or the surface position of the film. In such a case, the detector 8 can be, for example, a laser displacement meter, an ultrasonic displacement meter, etc. The detector 8 may be an optical sensor or an image sensor that detects the surface state of the film, etc.

For example, the temperature, the thickness, and the surface state of the detected liquid film can be used to control the supercooled state of the liquid 101 in the supercooling process described below. Note that controlling the supercooled state means controlling the curve of the temperature change of the liquid 101 in the supercooled state so that the liquid 101 is not frozen due to rapid cooling, that is, the supercooled state is maintained.

For example, the temperature, the thickness, and the surface state of the detected liquid film or the temperature, the thickness, and the surface state of the film in which the liquid 101 and the frozen liquid 101 are mixed can be used to detect the start of the freezing process (solid-liquid phase) described below.

For example, the temperature, the thickness, and the surface state of the detected frozen film can be used to detect the "occurrence of cracks" in the freezing process (solid phase) described below.

For example, when the detector 8 detects the temperature, the "occurrence of cracks" can be indirectly detected from the temperature of the frozen film in the freezing process (solid phase) described below. When the detector 8 detects the thickness, the "occurrence of cracks" can be detected from the change of the surface position of the frozen film in the freezing process (solid phase) described below. When the detector 8 detects the surface state, the "occurrence of cracks" can be detected from the surface state of the frozen film in the freezing process (solid phase) described below.

Cracks will now be described. Cracks occur when the stress corresponding to the difference between the thermal expansion coefficient of the frozen film and the thermal expansion coefficient of the substrate 100 becomes large. For example, when the substrate 100 is a quartz substrate, cracks occur in the frozen film that cannot withstand the increased stress when the temperature of the frozen film becomes −50° C. or less. Because contaminants are incorporated into the frozen film, the contaminants are detached from the surface 100b of the substrate 100 when cracks occur and the frozen film deforms. Therefore, the removal rate of the contaminants can be improved.

Details related to the effect of cracks are described below.

However, an impact force is generated when cracks occur. Therefore, when an uneven portion is formed in the surface 100b of the substrate 100, there is a risk that the uneven portion may collapse due to the impact force. In other words, according to the state of the surface 100b of the substrate 100, there are cases where it is favorable for cracks to occur, and there are also cases where it is favorable for cracks not to occur.

For example, if the occurrence of cracks can be detected by the detector 8, the temperature at which cracks occur or the interval from the freezing start of the liquid film until cracks occur can be predetermined. Accordingly, the temperature at which the frozen film is thawed or the interval from the freezing start of the liquid film until thawing can be selected according to the state of the surface 100b of the substrate 100. Also, the detector 8 can provide a warning of the collapse of the uneven portion when detecting the occurrence of cracks.

The exhaust part 9 is connected to the outlet 6c via an exhaust pipe 6c1. The exhaust part 9 discharges the used cooling gas 3a1 and air 7a outside the housing 6. The exhaust part 9 can be, for example, a pump, a blower, etc. The used liquids 101 and 102 are discharged outside the housing 6 via a discharge pipe 6c2 connected to the exhaust pipe 6c1.

The controller 10 controls the operations of the components included in the substrate treatment device 1. The controller 10 includes, for example, a calculator such as a CPU (Central Processing Unit) or the like, memory such as semiconductor memory, etc. The controller 10 is, for example, a computer. The memory can store control programs that control the operations of the components included in the substrate treatment device 1. The calculator uses the control programs stored in the memory, data input by an operator, data from the detector 8, etc., to control the operations of the components included in the substrate treatment device 1.

For example, the cooling rate of the liquid 101 has a correlation with the thickness of the liquid film. For example, the cooling rate of the liquid 101 increases as the thickness of the liquid film decreases. Conversely, the cooling rate of the liquid 101 decreases as the thickness of the liquid film increases. Therefore, for example, the controller 10 can control the flow rate of the cooling gas 3a1 as well as the cooling rate of the liquid 101 based on the thickness of the liquid 101 (the thickness of the liquid film) detected by the detector 8. The control of the temperature and/or the cooling rate of the liquid 101 is performed when controlling the supercooled state of the liquid 101 in the supercooling process described below.

Therefore, for example, the controller 10 causes the liquid 101 on the surface 100b of the substrate 100 to reach the supercooled state by controlling at least one of the rotation of the substrate 100, the flow rate of the cooling gas 3a1, or the supply rate of the liquid 101.

For example, based on a signal from the detector 8, the controller 10 can determine whether or not the liquid 101 that is in the supercooled state has started to freeze. For example, the controller 10 can start the thawing of the frozen liquid 101 after a prescribed interval has elapsed from the start of the freezing of the liquid 101.

Details related to the start of the freezing of the liquid 101 in the supercooled state and the start of the thawing of the frozen liquid 101 are described below.

Operations of the substrate treatment device 1 will now be illustrated.

Figure 2:
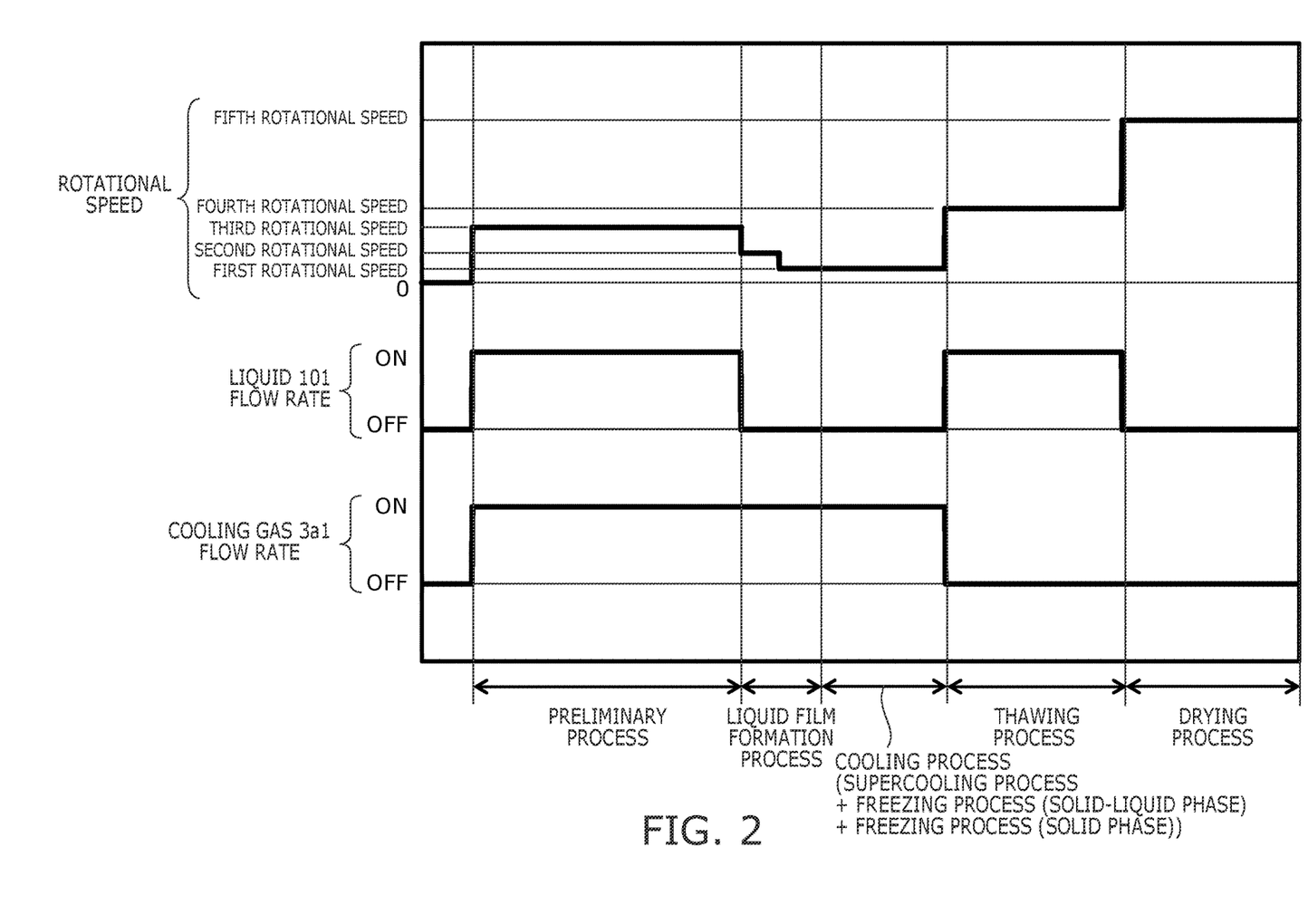
FIG. 2 is a timing chart illustrating the operations of the substrate treatment device.

FIG. 2 is a timing chart illustrating the operations of the substrate treatment device 1.

Figure 3:
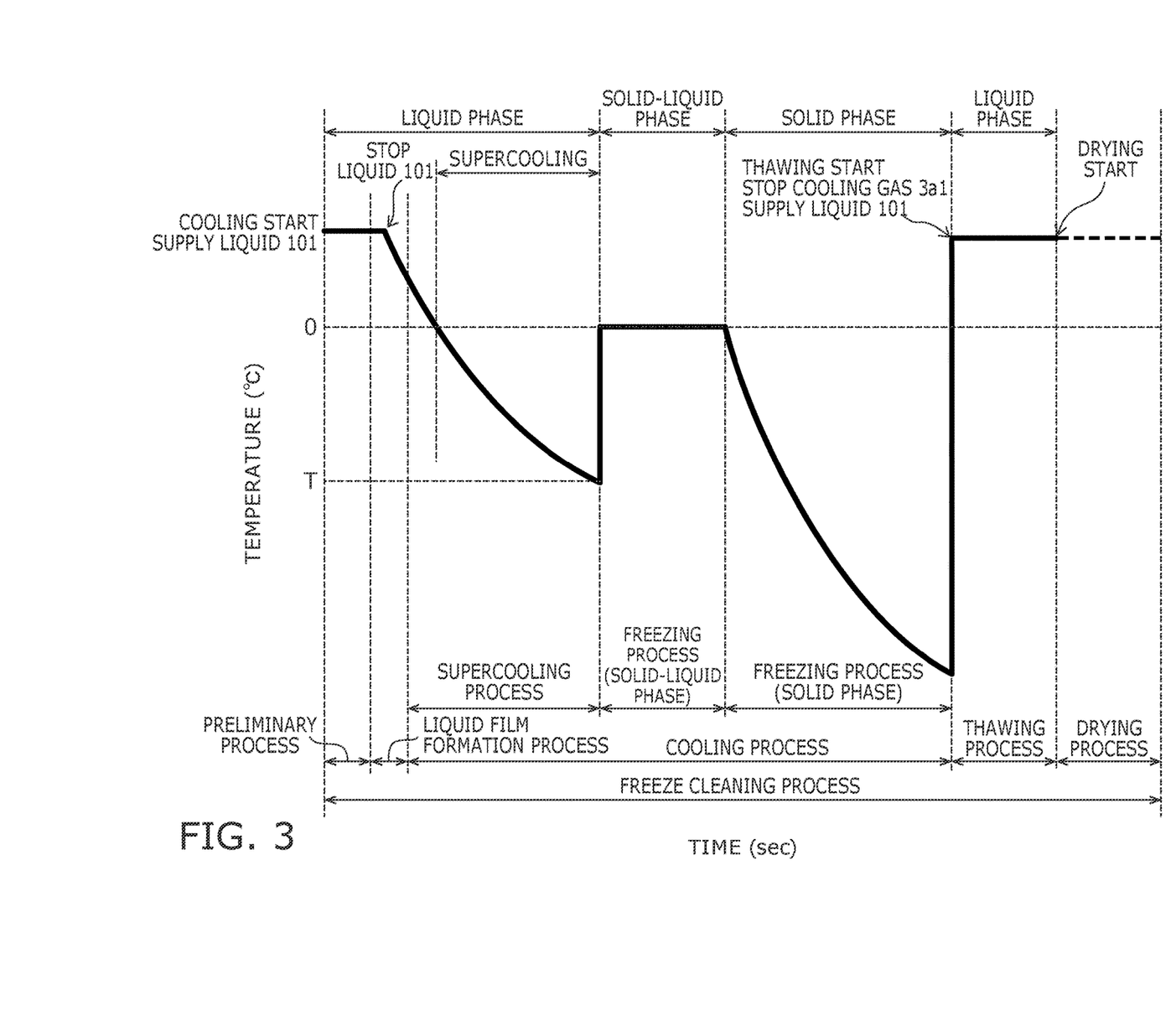
FIG. 3 is a graph illustrating the temperature change of the liquid supplied to the substrate.

FIG. 3 is a graph illustrating the temperature change of the liquid 101 supplied to the substrate 100.

In FIGS. 2 and 3, the substrate 100 is a 6025 quartz (Qz) substrate (152 mm×152 mm×6.35 mm), and the liquid 101 is purified water.

First, the substrate 100 is transferred into the housing 6 via a not-illustrated carry-in/carry-out port of the housing 6. The transferred substrate 100 is placed on and supported by the multiple supporters 2a1 of the placement platform 2a.

After the substrate 100 is supported by the placement platform 2a, a freeze cleaning process that includes a preliminary process, a formation process of a liquid film, a cooling process, a thawing process, and a drying process is performed as shown in FIG. 2.

First, the preliminary process is performed as shown in FIGS. 2 and 3. In the preliminary process, the controller 10 controls the supplier 4b and the flow rate controller 4c to supply the liquid 101 at a prescribed flow rate to the surface 100b of the substrate 100. The controller 10 controls the flow rate controller 3c to supply the cooling gas 3a1 at a prescribed flow rate to the back surface 100a of the substrate 100. The controller 10 controls the driver 2c to rotate the substrate 100 at a third rotational speed.

Here, there is a possibility that contamination may be caused when the atmosphere inside the housing 6 is cooled by the supply of the cooling gas 3a1 by the cooling part 3, and frost that includes dust of the atmosphere adheres to the substrate 100. In the preliminary process, the adhesion of frost to the surface 100b of the substrate 100 can be prevented while uniformly cooling the substrate 100 because the supply of the liquid 101 to the surface 100b of the substrate 100 is continued.

In the example of FIG. 2, the third rotational speed of the substrate 100 is, for example, about 50 rpm to 500 rpm. The flow rate of the liquid 101 is, for example, about 0.1 L/min to 1.0 L/min. The flow rate of the cooling gas 3a1 is, for example, about 40 NL/min to 200 NL/min. The process time of the preliminary process is, for example, about 1800 seconds. The process time of the preliminary process may be any time as long as the in-plane temperature of the substrate 100 becomes substantially uniform, and can be obtained by conducting experiments or simulations in advance.

In the preliminary process, the temperature of the liquid film is substantially equal to the temperature of the supplied liquid 101 because the liquid 101 is in a flowing state. For example, when the temperature of the supplied liquid 101 is about room temperature (20° C.), the temperature of the liquid film also is about room temperature (20° C.).

Then, a formation process of a liquid film is performed as shown in FIGS. 2 and 3. In the formation process of the liquid film, the controller 10 controls the driver 2c to rotate the substrate 100 at a second rotational speed. The second rotational speed is such that the thickness of the liquid film becomes a thickness at which a high removal rate is obtained. The second rotational speed is, for example, 50 rpm to 100 rpm. That is, the controller 10 rotates the substrate 100 at a rotational speed that is equal to the rotational speed in the preliminary process or less than the rotational speed in the preliminary process.

Continuing as shown in FIG. 2, the supply of the liquid 101 supplied in the preliminary process is stopped, and the substrate 100 is rotated at the second rotational speed until the prescribed thickness is obtained. The prescribed thickness may be confirmed by the detector 8 measuring the thickness of the liquid film. The thickness of the liquid film may be measured using the detector 8; the interval until the measured thickness becomes the prescribed thickness may be pre-calculated; and the second rotational speed may be maintained during the interval until the prescribed thickness is obtained.

Subsequently, the rotational speed of the substrate 100 is set to a first rotational speed. The first rotational speed is about a rotational speed such that the liquid film of the liquid 101 supplied onto the substrate 100 is maintained at a uniform thickness. It is sufficient for the first rotational speed to be able to suppress fluctuation of the thickness of the liquid film due to the centrifugal force; and it is sufficient for the first rotational speed to be, for example, about 0 rpm to 50 rpm.

The flow rate of the cooling gas 3a1 in the formation process of the liquid film is set to be equal to the flow rate of the cooling gas 3a1 in the preliminary process. As described above, the in-plane temperature of the substrate 100 is substantially uniform in the preliminary process. By maintaining the flow rate of the cooling gas 3a1 in the formation process of the liquid film to be equal to that of the preliminary process, the in-plane temperature of the substrate 100 can be maintained in a substantially uniform state.

When it is desirable for the thickness of the liquid film to be thick, the first rotational speed can be set after the third rotational speed without setting the rotational speed to the second rotational speed. In such a case, it is favorable for the first rotational speed to be near 0 rpm. In particular, fluctuation of the thickness of the liquid film due to the centrifugal force can be further suppressed by stopping the rotation of the substrate 100.

The rotational speed may be set to the first rotational speed in the preliminary process and the formation process of the liquid film. Also, the third rotational speed may be slower than the first rotational speed.

When transitioning from the preliminary process to the formation process of the liquid film, the liquid 101 that is supplied in the preliminary process may be discharged by rotating the substrate 100 at a high speed. In such a case, after discharging the liquid 101, it is sufficient to supply a prescribed amount of the liquid 101 to the substrate 100 after stopping the rotation of the substrate 100 or after setting the rotational speed of the substrate 100 to about a rotational speed (50 rpm) or less so that the liquid film is maintained at a uniform thickness. Thus, a liquid film that has the prescribed thickness can be easily formed.

As described below, the thickness of the liquid film when performing the supercooling process (the thickness of the liquid film formed in the liquid film formation process) can be about 300 μm to 1300 μm. For example, the controller 10 controls the supply rate of the liquid 101 and the rotational speed of the substrate 100 so that the thickness of the liquid film on the surface 100b of the substrate 100 is about 300 μm to 1300 μm.

Details related to the thickness of the liquid film when performing the supercooling process are described below.

Then, the cooling process is performed as shown in FIGS. 2 and 3. According to the embodiment, the interval in the cooling process up to the start of the freezing of the liquid 101 in the supercooled state is called the "supercooling process"; the interval in the cooling process from the start of the freezing of the liquid 101 in the supercooled state until before the freezing is completely completed is called the "freezing process (solid-liquid phase)"; and the interval in the cooling process of further cooling the frozen liquid 101 is called the "freezing process (solid phase)".

For example, only the liquid 101 exists at the surface 100b of the substrate 100 in the supercooling process. For example, the liquid 101 and the frozen liquid 101 exist at the surface 100b of the substrate 100 in the freezing process (solid-liquid phase). For example, only the frozen liquid 101 exists at the surface 100b of the substrate 100 in the freezing process (solid phase).

The solid-liquid phase means that the liquid 101 and the frozen liquid 101 exist over the entirety. The state of only the frozen liquid 101 is called a frozen film 101a.

First, in the supercooling process, the supply of the cooling gas 3a1 to the back surface 100a of the substrate 100 is continued, and the temperature of the liquid film on the substrate 100 drops below the temperature of the liquid film in the formation process of the liquid film to reach a supercooled state.

Here, the liquid 101 undesirably freezes quickly without reaching the supercooled state if the cooling rate of the liquid 101 is too fast. Therefore, the controller 10 controls at least one of the rotational speed of the substrate 100, the flow rate of the cooling gas 3a1, or the supply rate of the liquid 101 so that the liquid 101 at the surface 100b of the substrate 100 reaches the supercooled state.

The control conditions of the liquid 101 reaching the supercooled state are affected by the size of the substrate 100, the viscosity of the liquid 101, the specific heat of the cooling gas 3a1, etc. It is therefore favorable to appropriately determine the control conditions for the liquid 101 reaching the supercooled state by performing experiments and/or simulations.

In the supercooled state, for example, the freezing of the liquid 101 starts in response to the temperature of the liquid film, the existence of bubbles, contaminants such as particles, vibrations, etc. For example, when contaminants such as particles, etc., exist, the freezing of the liquid 101 starts when a temperature T of the liquid 101 is not less than −35° C. and not more than −20° C. Also, the freezing of the liquid 101 can be started by applying a vibration to the liquid 101 by causing the rotation of the substrate 100 to fluctuate, etc.

When the freezing of the liquid 101 in the supercooled state starts, the supercooling process transitions to the freezing process (solid-liquid phase). As described above, in the liquid 101 in the supercooled state, contaminants form some percentage of the starting points of the freezing start. It is considered that the contaminants that are adhered to the surface 100b of the substrate 100 are detached due to the contaminants being starting points of the freezing start, the pressure wave accompanying the volume change when the liquid 101 changes to a solid, a physical force accompanying the volume increase, etc. Therefore, the contaminants that are adhered to the surface 100b of the substrate 100 can be detached by the pressure wave, the physical forces, etc., generated when a portion of the liquid 101 freezes.

In the freezing process (solid-liquid phase), the liquid film does not freeze in an instant. In the freezing process (solid-liquid phase), the liquid 101 and the frozen liquid 101 exist over the entire surface 100b of the substrate 100.

Latent heat is generated when the liquid 101 freezes. The temperature of the frozen liquid 101 increases to the freezing point due to the emission of latent heat. When the temperature of the liquid film of the liquid 101 is detected by the detector 8, the instant at which the temperature of the liquid film increases to the vicinity of the freezing point can be used as the timing of the start of the freezing.

In the freezing process (solid-liquid phase) as well, the cooling gas 3a1 is supplied to the back surface 100a of the substrate 100. Therefore, the cooling rate and the generation rate of the latent heat are balanced, and the temperature is maintained at a constant temperature that is slightly less than the freezing point. The generation of the latent heat stops when the liquid film completely freezes and an ice film is formed. On the other hand, the supply of the cooling gas 3a1 to the back surface 100a of the substrate 100 is maintained. Accordingly, when the frozen film 101a is formed, the temperature of the frozen film 101a starts to decrease.

When the liquid film at the surface 100b of the substrate 100 is completely frozen, the freezing process (solid-liquid phase) transitions to the freezing process (solid phase). As described above, the temperature of the frozen film 101a at the surface 100b of the substrate 100 further decreases in the freezing process (solid phase).

Here, mainly water is included in the liquid 101. Therefore, the volume of the frozen film 101a contracts when the liquid film at the surface 100b of the substrate 100 completely freezes, the frozen film 101a is formed, and the temperature of the frozen film 101a further decreases; and stress is generated in the frozen film 101a. When the substrate 100 is a quartz substrate, for example, cracks occur in the frozen film 101a when the temperature of the frozen film 101a becomes −50° C. or less.

The effects of cracks will now be described.

A contaminant 103 that is adhered to the surface 100b of the substrate 100 is detached from the surface 100b of the substrate 100 when a crack occurs in the frozen film 101a. Although the mechanism of the contaminant 103 being detached from the surface 100b of the substrate 100 is not exactly clear, the mechanism can be considered to be as follows.

Figure 4A:
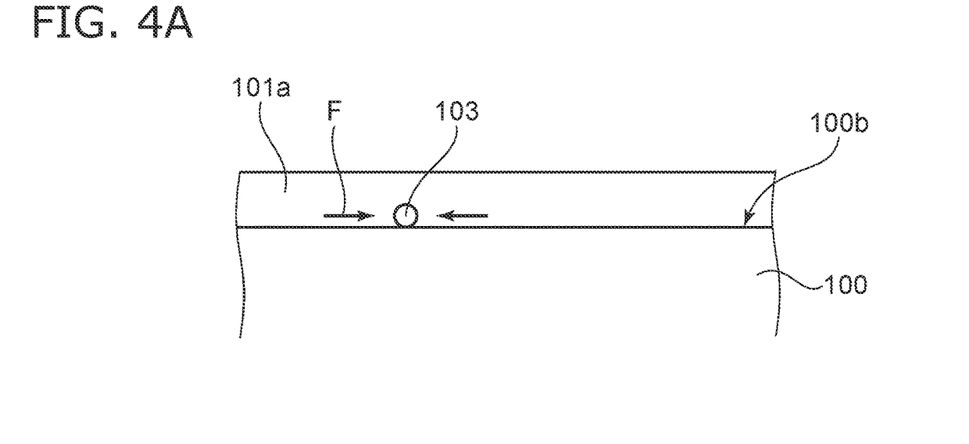
FIGS. 4A and 4B are schematic views for illustrating a detachment mechanism of a contaminant.
Figure 4B:
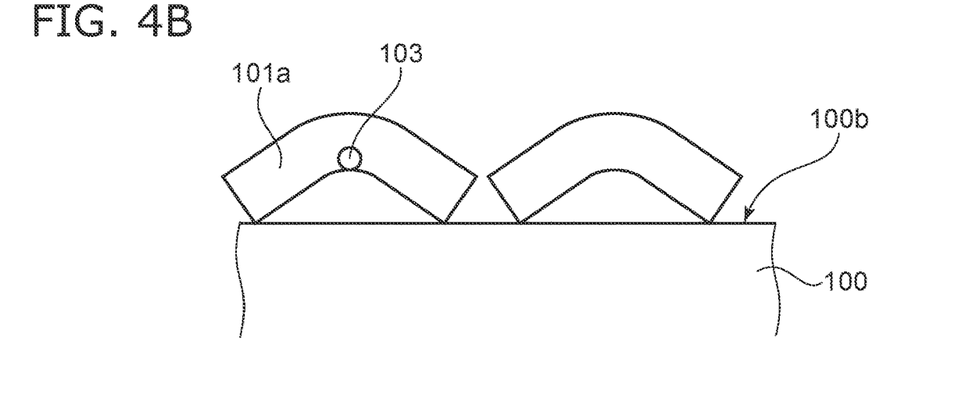

FIGS. 4A and 4B are schematic views for illustrating a detachment mechanism of the contaminant 103.

As shown in FIG. 4A, when the temperature of the frozen film 101a decreases in the freezing process (solid phase), stress F that corresponds to the difference between the thermal expansion coefficient of the frozen film 101a and the thermal expansion coefficient of the substrate 100 is generated.

Then, when the temperature of the frozen film 101a further decreases (e.g., becomes −50° C. or less) as shown in FIG. 4B, the frozen film 101a cannot withstand the increased stress F, and a crack occurs in the frozen film 101a. In such a case, generally, the thermal expansion coefficient of the frozen film 101a that includes water as a major component is greater than the thermal expansion coefficient of the substrate 100; therefore, the frozen film 101a deforms outward in a convex shape as shown in FIG. 4B; and a crack occurs.

Because the contaminant 103 is incorporated in the frozen film 101a, the contaminant 103 is detached from the surface 100b of the substrate 100 as shown in FIG. 4B when the frozen film 101a deforms outward in the convex shape (when the crack occurs).

However, as described above, an impact force is generated when the crack occurs. There are cases where an uneven portion formed in the surface 100b of the substrate 100 collapses when the impact force is generated.

Figure 5:
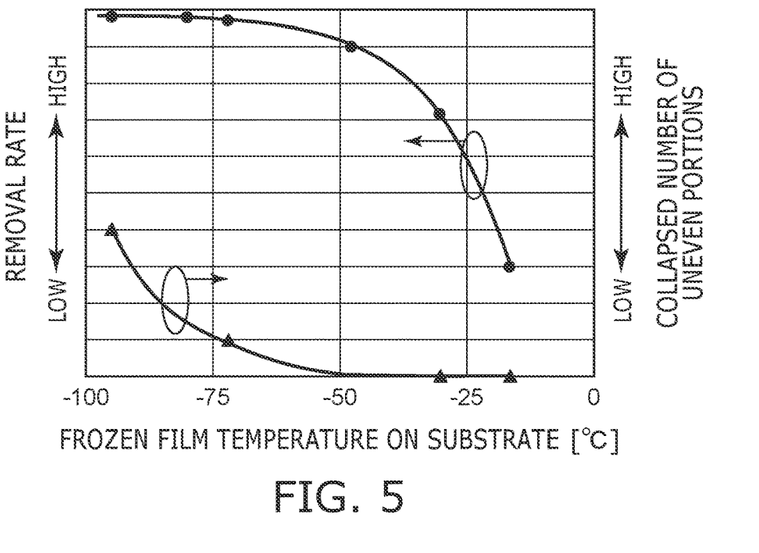
FIG. 5 is a graph illustrating the relationship between the temperature of the frozen film on the substrate and the removal rate of the contaminants and the relationship between the temperature of the frozen film and the collapsed number of uneven portions.

FIG. 5 is a graph illustrating the relationship between the temperature of the frozen film 101a and the removal rate of the contaminant 103 on the substrate 100 and the relationship between the temperature of the frozen film 101a and the collapsed number of uneven portions. FIG. 5 is a graph when the substrate 100 is a quartz substrate.

As described above, when the substrate 100 is a quartz substrate, cracks easily occur in the frozen film 101a when the temperature of the frozen film 101a is not more than −50° C. It can be seen from FIG. 5 that when the temperature of the frozen film 101a is not more than −50° C., the removal rate of the contaminant 103 increases due to the occurrence of cracks. However, when the temperature of the frozen film 101a is not more than −50° C., the collapsed number of uneven portions increases due to the impact force generated by cracks.

It is therefore favorable to start the thawing before cracks occur when a fine uneven portion or an uneven portion having low rigidity is formed in the surface 100b of the substrate 100. Thus, the collapse of the uneven portion can be suppressed because an impact force due to cracks is not generated. In such a case, the removal rate of the contaminant 103 in one freeze cleaning process is low; however, by repeatedly performing the freeze cleaning process, the suppression of the collapse of uneven portions and the improvement of the removal rate of the contaminant 103 can be realized.

On the other hand, when an uneven portion is not formed in the surface 100b of the substrate 100 (e.g., in the case of a bulk substrate), or when an uneven portion having high rigidity is formed, it is favorable to start the thawing after causing cracks to occur. Thus, the removal rate of the contaminant 103 can be improved. Also, the number of repetitions of the freeze cleaning process can be reduced when repeatedly performing the freeze cleaning process.

For example, the controller 10 can repeatedly perform a set of processes a predetermined number of times, in which the set of processes includes a process of causing the liquid 101 to reach a supercooled state, a process of freezing the liquid 101 in the supercooled state, and a process of starting the thawing of the frozen liquid 101 after a prescribed interval has elapsed from the start of the freezing of the liquid 101.

The execution count of the freeze cleaning process is input by an operator via a not-illustrated input/output screen. Or, the substrate treatment device 1 may read a mark such as a barcode, a QR code (registered trademark), etc., attached to a case that stores the substrate 100.

As described above, FIG. 5 is a graph obtained when the substrate 100 is a quartz substrate. Cracks occur when the stress corresponding to the difference between the thermal expansion coefficient of the frozen film and the thermal expansion coefficient of the substrate 100 becomes large. That is, for the same type of the liquid 101, the temperature at which cracks occur changes according to the material of the substrate 100. The temperature at which cracks occur in the frozen film also changes according to the thickness of the liquid 101. Therefore, experiments and/or simulations may be used to predetermine how the temperature at which cracks occur changes according to the combination of the type of the substrate 100 and the thickness of the liquid 101; and the prescribed temperature may be calculated from the determined temperature.

Returning now to FIGS. 2 and 3, the operations of the substrate treatment device 1 will be described further.

As shown in FIGS. 2 and 3, a thawing process is performed after the freezing process (solid phase).

In the example of FIGS. 2 and 3, the liquid 101 and the liquid 102 are the same liquid. Therefore, the liquid 101 is recited in FIGS. 2 and 3. In the thawing process, the controller 10 controls the supplier 4b and the flow rate controller 4c to supply the liquid 101 at a prescribed flow rate to the surface 100b of the substrate 100. When the liquid 101 and the liquid 102 are different, the controller 10 controls the supplier 5b and the flow rate controller 5c to supply the liquid 102 at a prescribed flow rate to the surface 100b of the substrate 100.

Also, the controller 10 controls the flow rate controller 3c to stop the supply of the cooling gas 3a1. The controller 10 controls the driver 2c to increase the rotational speed of the substrate 100 to a fourth rotational speed. The fourth rotational speed can be, for example, about 200 rpm to 700 rpm.

As the rotation of the substrate 100 increases, the liquid 101 and the frozen liquid 101 can be flung off by the centrifugal force. Therefore, the liquid 101 and the frozen liquid 101 can be discharged from the surface 100b of the substrate 100. At this time, the contaminants 103 that are detached from the surface 100b of the substrate 100 also are discharged together with the liquid 101 and the frozen liquid 101.

The supply rate of the liquid 101 or the liquid 102 is not particularly limited as long as the thawing can be performed. Also, the fourth rotational speed of the substrate 100 is not particularly limited as long as the liquid 101, the frozen liquid 101, and the contaminant 103 can be discharged.

Then, a drying process is performed as shown in FIGS. 2 and 3. In the drying process, the controller 10 controls the supplier 4b and the flow rate controller 4c to stop the supply of the liquid 101. When the liquid 101 and the liquid 102 are different liquids, the controller 10 controls the supplier 5b and the flow rate controller 5c to stop the supply of the liquid 102.

Also, the controller 10 controls the driver 2c to increase the rotational speed of the substrate 100 to a fifth rotational speed that is faster than the fourth rotational speed. The drying of the substrate 100 can be rapidly performed by increasing the rotation of the substrate 100. The fifth rotational speed of the substrate 100 is not particularly limited as long as the drying can be performed.

The substrate 100 for which the freeze cleaning process has finished is transferred from the housing 6 via a not-illustrated carry-in/carry-out port of the housing 6.

Thus, one freeze cleaning process can be performed.

As described above, the freeze cleaning process can be performed multiple times. Therefore, if a subsequent freeze cleaning process will be performed, the supply of the cooling gas 3a1 also can be maintained in the thawing process. Thus, the same state as the preliminary process can be generated, and the preliminary process of the next freeze cleaning process can be omitted. Also, the drying process of the freeze cleaning process that is currently performed (the present freeze cleaning process) can be omitted.

For example, when performing the freeze cleaning process repeatedly multiple times, it is sufficient for one freeze cleaning process to include at least the supercooling process, the freezing process (solid-liquid phase), the freezing process (solid phase), and the thawing process.

Here, generally, the timing of starting the thawing process is performed using time management. For example, the timing at which some interval has elapsed from the placement of the substrate 100 on the multiple supporters 2a1 of the placement platform 2a is used as the timing of the start of the freeze cleaning process. In such a case, the frozen film 101a is formed in the predetermined interval from the start of the freeze cleaning process by performing the preliminary process, the liquid film formation process, the cooling process (the supercooling process, the freezing process (solid-liquid phase), and the freezing process (solid phase)). Then, after the predetermined interval has elapsed, the liquid 101 (102) is supplied, and the frozen film 101a is thawed. In such a case, the timing of starting the thawing process is appropriately determined by performing experiments and/or simulations.

As described above, it is considered that, for example, the appropriate timing of starting the thawing process can be determined if experiments and/or simulations are performed according to the size of the substrate 100 because management is possible using the thickness of the liquid film, the components of the liquid 101, the flow rate of the cooling gas 3a1, etc.

Also, if the preliminary process described above is performed, it is considered that the interval from the start of the freeze cleaning process until the frozen film 101a is formed can be stabilized because the liquid film can be formed in a state in which the in-plane temperature of the substrate 100 is substantially uniform.

However, as a result of repeating diligent experiments and analysis, the inventors found that the timing from the stop of the supply of the liquid 101 until the freezing starts fluctuates.

Figure 6:
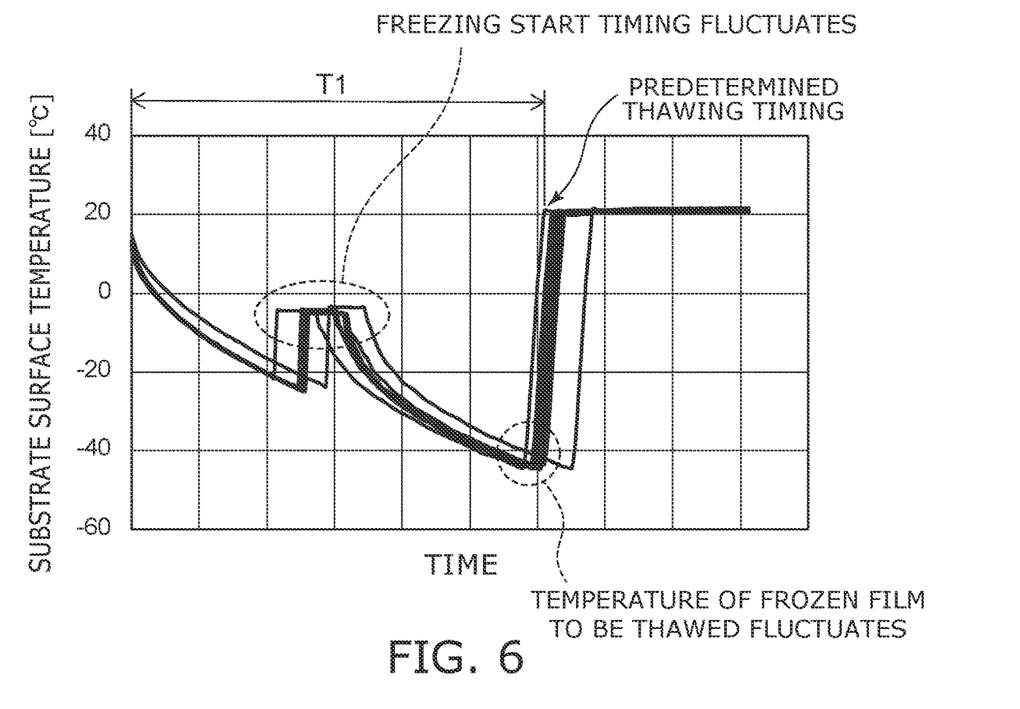
FIG. 6 is a graph illustrating the temperature change of the surface of the substrate in freeze cleaning processes when the substrate treatment device according to the embodiment is used to repeatedly perform the freeze cleaning process.

FIG. 6 is a graph illustrating the temperature change of the surface 100b of the substrate 100 in freeze cleaning processes when the substrate treatment device 1 according to the embodiment is used to repeatedly perform the freeze cleaning process.

FIG. 6 shows the temperature change of the liquid 101 that corresponds to the interval from "stop liquid 101" in the "liquid film formation process" shown in FIG. 3 to the thawing process. In FIG. 6, "T1" shows the predetermined interval in the case where the timing of starting the thawing from the stop of the supply of the liquid 101 is used as the predetermined interval. The number of repetitions of the freeze cleaning process is 10 times. The substrate 100 is a quartz substrate. The "substrate 100 surface" includes not only the surface 100b of the substrate 100 but also the liquid 101 supplied to the substrate 100, the liquid film formed at the surface 100b of the substrate 100, the state in which the liquid 101 and the frozen liquid 101 exist at the surface 100b of the substrate 100, and the frozen film 101a formed at the surface 100b of the substrate 100. Graduation lines of the horizontal axis of FIG. 6 are spaced at constant intervals.

It can be seen from FIG. 6 that fluctuation occurs for the timing at which the freezing starts from the stop of the supply of the liquid 101. Although the cause of the fluctuation of the timing at which the freezing starts occurs is not exactly clear, it is considered that the existence of multiple conditions at which the freezing of the liquid 101 in the supercooled state starts is one factor. For example, multiple factors in the liquid 101 in the supercooled state become starting points of the freezing start such as a density change due to a nonuniform temperature of the liquid film, the existence of contaminants such as particles or the like, vibrations, etc. Therefore, the freezing may or may not start due to a change of at least one of the multiple conditions. Also, it is difficult to control the timing at which the freezing is started because the freezing is started by multiple conditions.

In such a case, if the thawing process is started when a predetermined interval T1 has elapsed from the stop of the supply of the liquid 101, it can be seen from FIG. 6 that the temperature of the frozen film 101a at the timing at which the thawing is started fluctuates. The desired removal rate is not obtained when the temperature of the frozen film 101a at the timing at which the thawing is started fluctuates. Or, when the temperature of the frozen film 101a at the timing at which the thawing is started fluctuates, cracks may or may not occur in the frozen film 101a to be thawed. In such a case, there is a risk that an uneven portion may collapse if a fine uneven portion or an uneven portion having low rigidity is formed in the surface 100b of the substrate 100.

As a result of investigations, the inventors obtained the knowledge that the fluctuation of the interval from the start of the freezing of the liquid 101 in the supercooled state until the frozen film 101a is cooled to the prescribed temperature is low.

Figure 7:
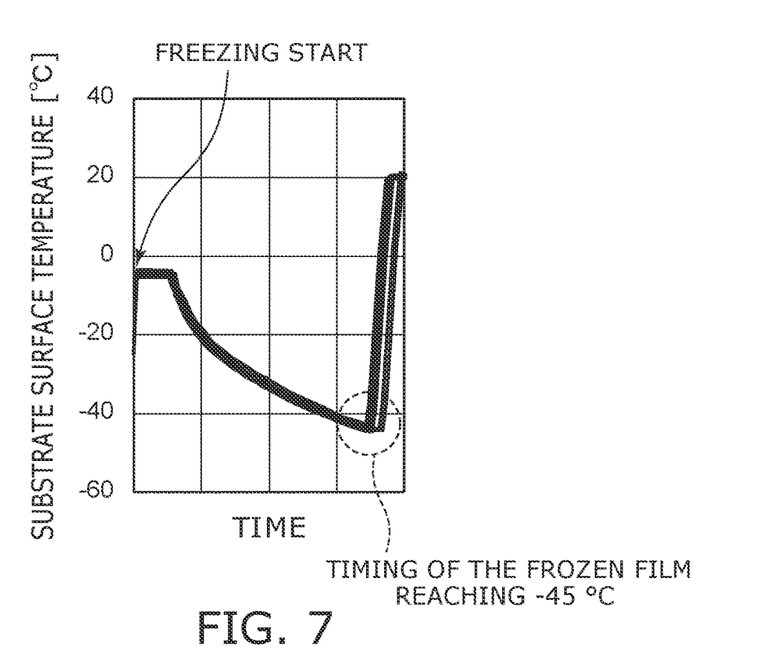
FIG. 7 is a graph illustrating the start of the freezing until the frozen film reaches the prescribed temperature.

FIG. 7 is a graph illustrating the interval from the start of the freezing until the frozen film 101a reaches the prescribed temperature.

In this case, the prescribed temperature is −45° C. In the interval from the start of the freezing until the thawing, the surface 100b of the substrate 100 includes the state in which the liquid 101 and the frozen liquid 101 exist and the state in which the frozen film 101a is formed at the surface 100b of the substrate 100. Therefore, the vertical axis of the graph is the "substrate 100 surface temperature". The graduation lines of the horizontal axis of FIG. 7 are spaced at constant intervals. Also, the constant intervals of FIGS. 6 and 7 are the same interval. That is, the spacings between the graduation lines in FIGS. 6 and 7 are the same.

It can be seen from FIG. 7 that the fluctuation of the interval from the start of the freezing until the frozen film 101a reaches the prescribed temperature is small even when the freeze cleaning process is repeatedly performed. The fluctuation of the interval from the start of the freezing until the frozen film 101a reaches the prescribed temperature is small compared to the fluctuation of the interval from the stop of the supply of the liquid 101 until the frozen film 101a reaches the prescribed temperature in FIG. 6.

Therefore, the fluctuation of the temperature of the frozen film 101a at the timing at which the thawing is started can be suppressed by using the detector 8 to detect the start of the freezing and by starting the thawing process after a prescribed interval has elapsed from the start timing of the detected freezing. If the temperature of the frozen film 101a at the timing at which the thawing is started does not fluctuate, the state of the frozen film 101a at the timing at which the thaw is started can be stabilized.

By controlling the interval until the thawing process is started, it is possible to control the temperature of the frozen film 101a at the timing at which the thawing is started as well as the state of the frozen film 101a to be thawed. For example, by setting the prescribed interval to a first interval, the controller 10 can suppress the occurrence of cracks in the frozen liquid 101 (the frozen film 101a) to be thawed. By setting the prescribed interval to a second interval that is greater than the first interval, the controller 10 can cause cracks to occur in the frozen liquid 101 (the frozen film 101a) to be thawed. Therefore, by changing the interval until the thawing process is started according to the state of the surface 100b of the substrate 100, the collapse of the uneven portion can be suppressed, and the removal rate of the contaminant 103 can be increased.

In such a case, for example, the detector 8 can detect the start of the freezing as follows.

Figure 8:
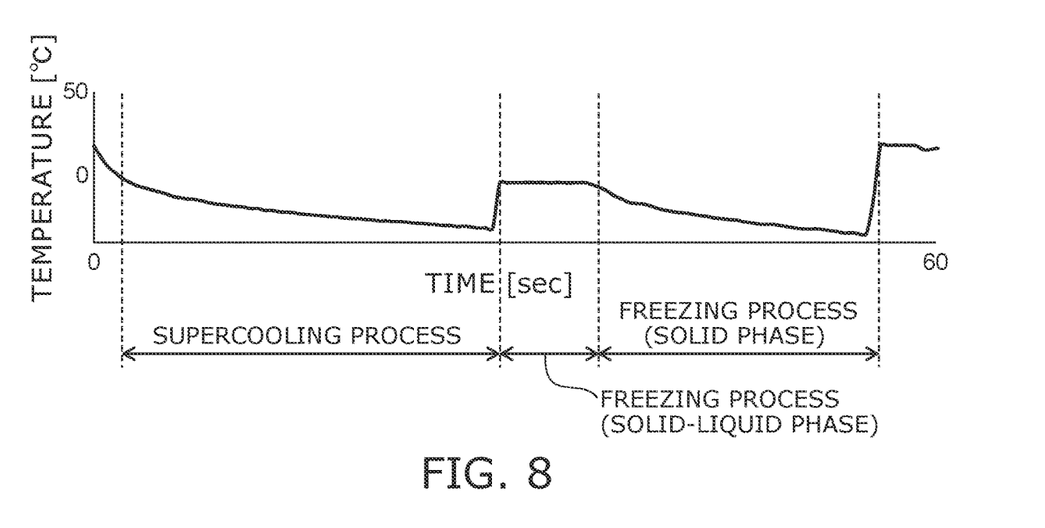
FIG. 8 is a graph illustrating the detected value when the detector is a temperature sensor that detects the temperature.

FIG. 8 is a graph illustrating the detected value when the detector 8 is a temperature sensor that detects the temperature.

Figure 9:
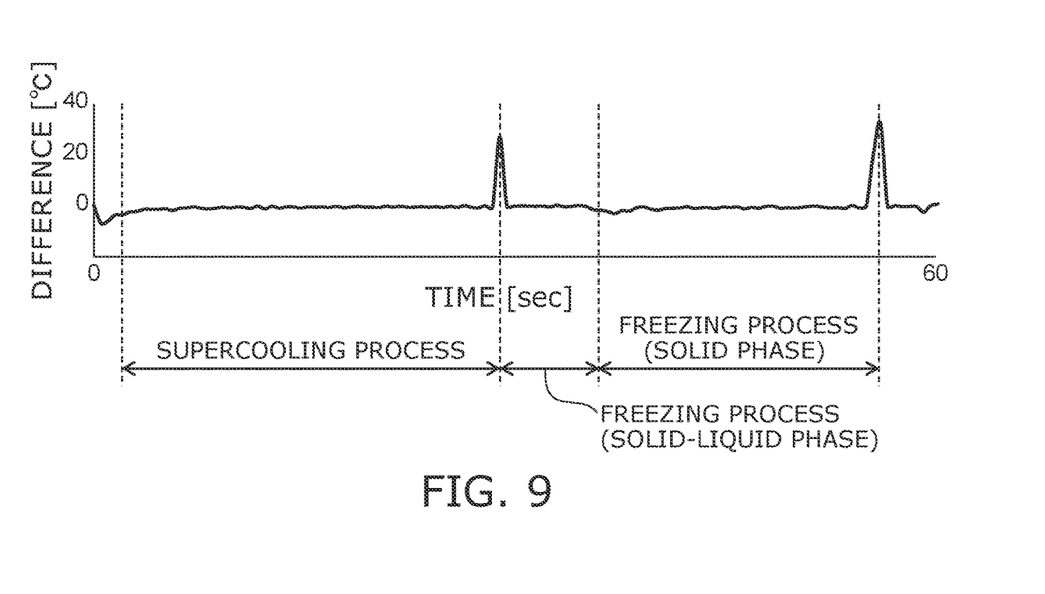
FIG. 9 is a graph illustrating the difference between one of the detected temperatures and the temperature detected directly before the one of the detected temperatures.

FIG. 9 is a graph illustrating the difference between one of the detected temperatures and the temperature detected directly before the one of the detected temperatures.

When the detector 8 is a temperature sensor that detects the temperature, etc., for example, the temperature of the surface of the liquid 101 in the supercooled state is detected at a prescribed time interval.

As shown in FIG. 8, the temperature increases when the liquid 101 in the supercooled state freezes. Then, the freezing of the liquid 101 can be determined to have started when the difference between one of the detected temperatures and the temperature detected directly before the one of the detected temperatures exceeds a prescribed threshold as shown in FIG. 9, and/or when the rate of the temperature increase exceeds a prescribed threshold as shown in FIG. 8. The thresholds used in the determination can be determined by performing experiments and/or simulations beforehand.

When cracks occur in the frozen film 101a, the likelihood of an uneven portion collapsing increases when a fine uneven portion or an uneven portion having low rigidity is formed in the surface 100b of the substrate 100. It is therefore favorable for the thawing temperature to be greater than the temperature at which cracks occur. Also, as shown in FIG. 5, there is a tendency for the removal rate to increase as the thawing temperature decreases. Accordingly, to obtain a high removal rate while suppressing the collapse of the uneven portion, it is favorable to thaw at a temperature that is 5° C. to 10° C. greater than the temperature at which cracks occur.

The temperature at which cracks occur may be predetermined by experiments and/or simulations. Then, the temperature (the prescribed temperature) that is 5° C. to 10° C. greater than the temperature at which cracks occur is stored in the controller 10.

The temperature at which cracks occur in the frozen film changes according to conditions such as the thickness of the liquid 101, the type of the substrate, etc. According to the conditions, there are cases where cracks occur at a temperature that is greater than −50° C., and there are also cases where the temperature at which cracks occur is not more than −50° C. A radiation thermometer cannot detect temperatures that are −50° C. or less. In such a case, the interval from the instant at which the liquid 101 in the supercooled state reaches the solid-liquid phase state (the start of the freezing) until cracks occur may be predetermined by experiments and/or simulations; and an interval that is 10 seconds to 30 seconds shorter than that interval may be stored in the controller 10 and used to perform the thawing.

Thus, the thawing can always be performed before cracks occur, even when cracks occur in a temperature range that the radiation thermometer cannot detect.

Setting the interval to be 10 seconds to 30 seconds shorter provides a temperature that is 5° C. to 10° C. greater than the temperature at which cracks occur.

Or, the interval from the instant at which the liquid 101 in the supercooled state reaches the solid-liquid phase state (the start of the freezing) until cracks occur may be predetermined by experiments and/or simulations; and an interval that is not less than 70% and not more than 90% of that interval may be stored in the controller and used to perform the thawing.

An interval that is not less than 70% and not more than 90% of the interval from the instant at which the liquid 101 in the supercooled state reaches the solid-liquid phase state (the start of the freezing) until cracks occur provides a temperature that is 5° C. to 10° C. greater than the temperature at which cracks occur.

When the detector 8 is a displacement meter that detects the thickness of the film and/or the surface position of the film, etc., for example, the surface position of the liquid 101 in the supercooled state is detected at a prescribed time interval.

The controller 10 can determine that the freezing of the liquid 101 has started when the difference between one of the detected surface positions and the surface position detected directly before the one of the detected surface positions exceeds a prescribed threshold, and/or when the rate of the change of the surface position exceeds a prescribed threshold. The thresholds that are used in the determination can be determined by performing experiments and/or simulations beforehand.

When the detector 8 is an optical sensor that detects the reflectance of the surface of the film, etc., for example, the reflectance of the surface of the liquid 101 in the supercooled state is detected at a prescribed time interval.

The controller 10 can determine that the freezing of the liquid 101 has started when the difference between one of the detected reflectances of the surface and the reflectance of the surface detected directly before the one of the detected reflectances of the surface exceeds a prescribed threshold, and/or when the rate of the change of the reflectance of the surface exceeds a prescribed threshold. The thresholds that are used in the determination can be determined by performing experiments and/or simulations beforehand.

When the detector 8 is an image sensor that detects the surface state of the film, etc., for example, the surface state of the liquid 101 in the supercooled state is imaged at a prescribed time interval.

The controller 10 discriminates the frozen liquid 101 by performing black and white binarization processing of the image. The controller 10 can determine that the freezing has started when the surface area, the number, the rate, etc., of the frozen liquid 101 exceeds a prescribed threshold, etc. The thresholds that are used in the determination can be determined by performing experiments and/or simulations beforehand.

The detector 8 is not limited to those illustrated; it is sufficient that the detector 8 can detect the start of the freezing of the liquid 101 on the surface 100b of the substrate 100.

Figure 10:
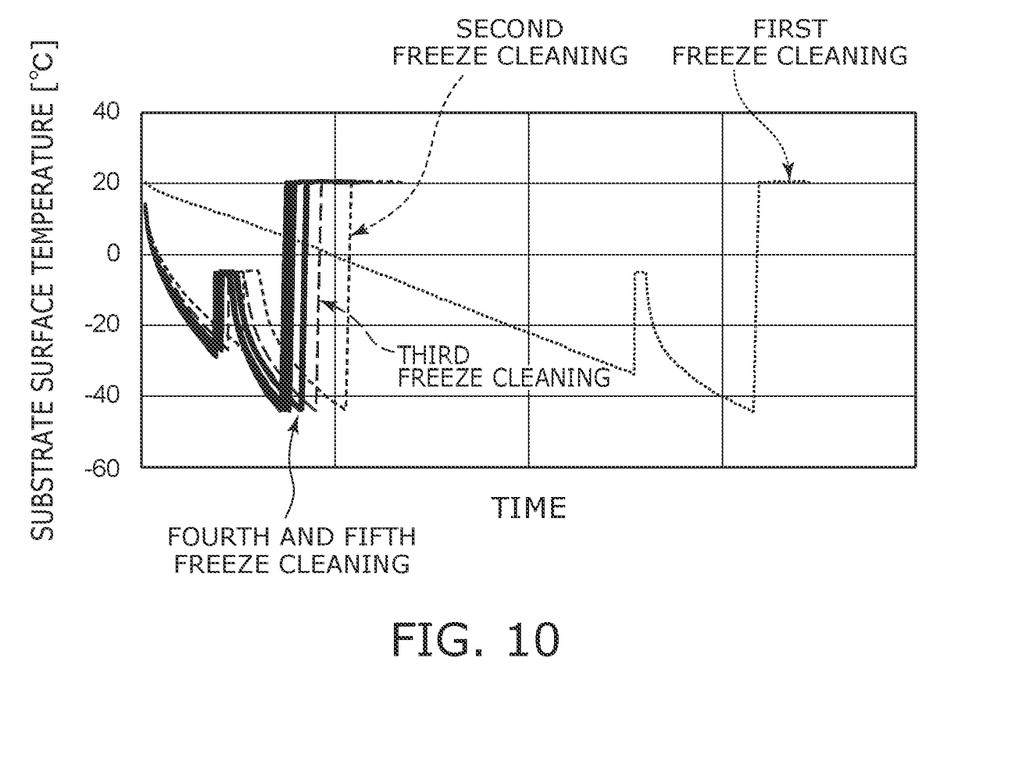
FIG. 10 is a graph illustrating the temperature change of the surface of the substrate in freeze cleaning processes when the substrate treatment device according to the embodiment is used to repeatedly perform the freeze cleaning process without performing the preliminary process.

FIG. 10 is a graph illustrating the temperature change of the surface 100b of the substrate 100 in freeze cleaning processes when the substrate treatment device according to the embodiment is used to repeatedly perform the freeze cleaning process without performing the preliminary process.

FIG. 10 differs from FIG. 6 in that the preliminary process is not performed. FIG. 10 shows the temperature change of the liquid 101 corresponding to the interval from "stop liquid 101" in the "liquid film formation process" shown in FIG. 3 to the thawing process.

As shown in FIG. 10, the interval from the stop of the supply of the liquid 101 until the start of the freezing in the first freeze cleaning process is long compared to those of the other freeze cleaning processes. As the second and third freeze cleaning processes are performed, the interval from the stop of the supply of the liquid 101 until the start of the freezing decreases; and by the sixth and subsequent freeze cleaning processes, the interval from the stop of the supply of the liquid 101 until the start of the freezing is substantially stable. Accordingly, when the preliminary process is not performed, a large fluctuation of the timing at which the freezing starts from the stop of the supply of the liquid 101 occurs for the initial (first to fifth) repetitions of the freeze cleaning process.

As a result of investigations, the inventors obtained the knowledge that greater fluctuation occurs in the interval from the start of the freezing until the frozen film 101a reaches the prescribed temperature when the preliminary process is not performed than when the preliminary process is performed. In particular, a large fluctuation occurs in the initial (first to fifth) repetitions of the freeze cleaning process; and the interval from the start of the freezing until the frozen film 101a reaches the prescribed temperature is substantially stable in the sixth and subsequent freeze cleaning processes.

In such a case, the fluctuation of the temperature of the frozen film 101a at the timing at which the thawing is started can be suppressed by using the detector 8 to detect the start of the freezing and by starting the thawing process when the frozen film 101a reaches the prescribed temperature from the start timing of the detected freezing. If the temperature of the frozen film 101a at the timing at which the thawing is started does not fluctuate, the temperature of the frozen film 101a at the timing at which the thawing is started can be maintained at a constant for each freeze cleaning process.

Also, by using the detector 8 to detect the start of the freezing, the thawing process can be prevented from being erroneously performed in a state in which the liquid film of the liquid 101 in the supercooled state is formed on the surface 100b of the substrate 100.

As described above, the temperature at which cracks occur in the frozen film 101a changes according to the conditions such as the thickness of the liquid 101, the type of the substrate, etc.

As a result of repeating diligent research, the inventors found that the supercooling temperature reaches −40° C.

For example, if the start of the freezing is not detected by the detector 8, and when the conditions are such that cracks undesirably occur in the frozen film 101a at −38° C., the thawing process undesirably starts at the instant that the temperature of the liquid film reaches −38° C. In such a case, by using the detector 8 to detect the start of the freezing, the thawing process can be started when the frozen film 101a reaches the prescribed temperature. As described above, the interval from the start of the freezing until the frozen film 101a reaches the prescribed temperature is stable in the sixth and subsequent freeze cleaning processes. Accordingly, the thawing process may be started in the first to fifth freeze cleaning processes when the frozen film 101a reaches the prescribed temperature after the start of the freezing is detected by the detector 8; and the thawing may be performed in the sixth and subsequent freeze cleaning processes when the prescribed interval has elapsed after the detector 8 detects the start of the freezing.

Hereinabove, exemplary embodiments of the invention are described with reference to specific examples. However, the invention is not limited to these specific examples. Additions, deletions, or design modifications of components or additions, omissions, or condition modifications of processes made appropriately by one skilled in the art for embodiments described above are within the scope of the invention to the extent that the features of the invention are included.

For example, the shapes, dimensions, numbers, arrangements, etc., of the components included in the substrate treatment device 1 are not limited to those illustrated and can be modified as appropriate.

What is claimed is:

1. A substrate treatment device, comprising:
   a placement platform configured to rotate a substrate;
   a cooling part configured to supply a cooling gas to a space between the placement platform and the substrate;
   a liquid supplier configured to supply a liquid to a surface of the substrate opposite to the placement platform side;
   a detector above the surface of the substrate, the detector being configured to detect a start of freezing of the liquid; and
   a controller configured to control a rotation of the substrate, a supply of the cooling gas, and a supply of the liquid, wherein
   the controller is configured to control at least one of the rotation of the substrate, a flow rate of the cooling gas, or a supply rate of the liquid to cause the liquid on the surface of the substrate to reach a supercooled state,
   the controller is configured to determine based on a signal from the detector that freezing of the liquid in the supercooled state has started, and the controller is configured to start thawing the frozen liquid after a prescribed interval has elapsed from the start of the freezing of the liquid, the prescribed interval is predetermined, and
the prescribed interval is an interval from an instant at which the freezing of the liquid in the supercooled state starts until a temperature of a surface of the frozen liquid reaches a temperature of not less than 5° C. and not more than 10° C. greater than a temperature at which a crack occurs in the frozen liquid.

2. The device according to claim 1, wherein
the controller is configured to determine the start of the freezing of the liquid by using:
   at least one of a temperature of a film of the liquid detected by the detector, a thickness of the film of the liquid detected by the detector, or a surface state of the film of the liquid detected by the detector, or
   at least one of a temperature of a film of a mixture of the liquid and the frozen liquid detected by the detector, a thickness of the film of the mixture of the liquid and the frozen liquid detected by the detector, or a surface state of the film of the mixture of the liquid and the frozen liquid detected by the detector.

3. The device according to claim 1, wherein
the detector is configured to detect a temperature of a surface of the liquid in the supercooled state at a prescribed time interval, and
the controller is configured to determine that the freezing of the liquid has started when
   the temperature of the liquid increases, and
   a difference between one of the detected temperatures and the temperature detected directly before the one of the detected temperatures exceeds a prescribed threshold, and/or a rate of the temperature increase exceeds a prescribed threshold.

4. The device according to claim 1, wherein
the detector is configured to detect a surface position of the liquid in the supercooled state at a prescribed time interval, and
the controller is configured to determine that the freezing of the liquid has started when a difference between one of the detected surface positions and the surface position detected directly before the one of the detected surface positions exceeds a prescribed threshold, and/or a rate of a change of the surface position exceeds a prescribed threshold.

5. The device according to claim 1, wherein
the detector is configured to detect a thickness of the liquid in the supercooled state at a prescribed time interval, and
the controller is configured to determine that the freezing of the liquid has started when a difference between one of the detected thicknesses and the thickness detected directly before the one of the detected thicknesses exceeds a prescribed threshold, and/or a rate of a change of the thickness exceeds a prescribed threshold.

6. The device according to claim 1, wherein
the detector is configured to detect a reflectance of a surface of the liquid in the supercooled state at a prescribed time interval, and
the controller is configured to determine that the freezing of the liquid has started when a difference between one of the detected reflectances and the reflectance detected directly before the one of the detected reflectances exceeds a prescribed threshold, and/or a rate of a change of the reflectance exceeds a prescribed threshold.

7. The device according to claim 1, wherein
the detector is configured to acquire images by imaging a surface state of the liquid in the supercooled state at a prescribed time interval, and
the controller is configured to determine that the freezing of the liquid has started when a difference between the surface state of one of the acquired images and the surface state of the image acquired directly before the one of the acquired images exceeds a prescribed threshold, and/or a rate of a change of the surface state exceeds a prescribed threshold.

8. The device according to claim 1, wherein
the prescribed interval is not less than 10 seconds and not more than 30 seconds shorter than an interval from an instant at which the freezing of the liquid in the supercooled state starts until the crack occurs.

9. The device according to claim 1, wherein
the prescribed interval is not less than 70% and not more than 90% of an interval from an instant at which the freezing of the liquid in the supercooled state starts until the crack occurs.

10. The device according to claim 1, wherein
the controller is configured to repeatedly perform a set of processes a predetermined number of times, and
the set of processes includes:
   causing the liquid to reach a supercooled state;
   freezing the liquid in the supercooled state; and
   starting a thawing of the frozen liquid after a prescribed interval has elapsed from the start of the freezing of the liquid.

11. The device according to claim 10, wherein
the controller is configured to perform a formation process of a liquid film before causing the liquid to reach the supercooled state, and
the formation process of the liquid film includes forming a film of the liquid having a prescribed thickness.

12. The device according to claim 11, wherein
the controller is configured to perform a preliminary process before the formation process of the liquid film, and
the preliminary process performs a preliminary cooling of the substrate.

13. The device according to claim 12, wherein
the controller is configured to set a flow rate of the cooling gas in the formation process of the liquid film to be equal to a flow rate of the cooling gas in the preliminary process.

14. The device according to claim 1, wherein
the detector is at least one of a radiation thermometer, a thermo-viewer, a thermocouple, a resistance thermometer bulb, a laser displacement meter, an ultrasonic displacement meter, an optical sensor, or an image sensor.

15. A substrate treatment device, comprising:
a placement platform configured to rotate a substrate;
a cooling part configured to supply a cooling gas to a space between the placement platform and the substrate;
a liquid supplier configured to supply a liquid to a surface of the substrate opposite to the placement platform side;
a detector above the surface of the substrate, the detector being configured to detect a start of freezing of the liquid; and
a controller configured to control a rotation of the substrate, a supply of the cooling gas, and a supply of the liquid, wherein the detector is configured to detect a temperature of a surface of the frozen liquid, and the controller is configured to control at least one of the rotation of the substrate, a flow rate of the cooling gas, or a supply rate of the liquid to cause the liquid on the surface of the substrate to reach a supercooled state, the controller is configured to determine based on a signal from the detector that freezing of the liquid in the supercooled state has started, and the controller is configured to start to thaw the frozen liquid when the temperature detected by the detector reaches a temperature of not less than 5° C. and not more than 10° C. greater than a predetermined temperature at which a crack occurs in the frozen liquid.

16. The device according to claim 15, wherein the controller is configured to repeatedly perform a set of processes a predetermined number of times, and the set of processes includes:
  causing the liquid to reach a supercooled state;
  freezing the liquid in the supercooled state; and
  starting a thawing of the frozen liquid after a prescribed interval has elapsed from the start of the freezing of the liquid.

17. The device according to claim 16, wherein the controller is configured to perform a formation process of a liquid film before causing the liquid to reach the supercooled state, and the formation process of the liquid film includes forming a film of the liquid having a prescribed thickness.

18. The device according to claim 15, wherein the detector is at least one of a radiation thermometer, a thermo-viewer, a thermocouple, or a resistance thermometer bulb.

\* \* \* \* \*